(12) United States Patent
Suetsuna et al.

(10) Patent No.: US 8,703,282 B2
(45) Date of Patent: Apr. 22, 2014

(54) CORE-SHELL TYPE MAGNETIC PARTICLE AND HIGH-FREQUENCY MAGNETIC MATERIAL

(75) Inventors: Tomohiro Suetsuna, Kawasaki (JP); Kouichi Harada, Tokyo (JP); Seiichi Suenaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 11/846,057

(22) Filed: Aug. 28, 2007

(65) Prior Publication Data
US 2008/0220231 A1    Sep. 11, 2008

(30) Foreign Application Priority Data

Mar. 9, 2007  (JP) ................. 2007-060667

(51) Int. Cl.
| B32B 7/02 | (2006.01) |
| B32B 5/16 | (2006.01) |
| C22C 38/00 | (2006.01) |
| C22C 19/00 | (2006.01) |

(52) U.S. Cl.
USPC ........ 428/216; 428/403; 428/404; 428/693.1; 428/702

(58) Field of Classification Search
USPC ........ 428/842.1–842.4, 216, 819.4, 826–830, 428/702
See application file for complete search history.

(56) References Cited

U.S. PATENT DOCUMENTS

| 2004/0043257 A1* | 3/2004 | Doushita et al. ........ 428/694 TC |
| 2005/0019558 A1* | 1/2005 | Verma et al. ................. 428/336 |
| 2005/0133116 A1 | 6/2005 | Nishijima et al. |
| 2005/0181202 A1 | 8/2005 | Kaneko et al. |
| 2008/0029300 A1 | 2/2008 | Harada et al. |

FOREIGN PATENT DOCUMENTS

| JP | 06-041617 | 2/1994 |
| JP | 2003-034849 | 2/2003 |
| JP | 2004-047088 | 2/2004 |
| JP | 2004-335744 | 11/2004 |
| JP | 2005-005286 | 1/2005 |
| JP | 2005-150257 | 6/2005 |
| JP | 2006-032907 | 2/2006 |
| JP | 2006-097123 | 4/2006 |
| JP | 2006-222357 | 8/2006 |

OTHER PUBLICATIONS

Tang et al. "Highly stable carbon-coated Fe/SiO2 composites: Synthesis, structure and magnetic properties". Carbon, 44 (2006), pp. 423-427.*
Walser et al. "Shape-Optimized Ferromagnetic Particles with Maximum Theoretical Microwave Susceptibility". IEEE Transactions of Magnetics, vol. 34, No. 4, (Jul. 1998); pp. 1390-1392.*
Machine Translation of JP2003-034849. Retrieved Jun. 3, 2012.*
Appendix III, "Iron-Carbon Diagrams". Retrieved Jan. 25, 2013.*
Japanese Office Action for 2008-060238 mailed on Aug. 30, 2011.

* cited by examiner

*Primary Examiner* — Prashant J Khatri
(74) *Attorney, Agent, or Firm* — Amin, Turocy & Watson, LLP

(57) ABSTRACT

A core-shell type magnetic particle comprises magnetic metal particle and an oxide coating layer formed on the surface of the magnetic metal particle. The magnetic metal particle contains a magnetic metal containing at least one selected from the group consisting of Fe, Co and Ni, a nonmagnetic metal and at least one element selected from carbon and nitrogen. The oxide coating layer is constituted of an oxide or a composite oxide containing the nonmagnetic metal which is one of the constituents of the magnetic metal particle.

10 Claims, No Drawings

CORE-SHELL TYPE MAGNETIC PARTICLE AND HIGH-FREQUENCY MAGNETIC MATERIAL

CROSS-REFERENCE TO RELATED APPLICATIONS

This application is based upon and claims the benefit of priority from prior Japanese Patent Application No. 2007-060667, filed Mar. 9, 2007, the entire contents of which are incorporated herein by reference.

BACKGROUND OF THE INVENTION

1. Field of the Invention

The present invention relates to a core-shell type magnetic particle and a high-frequency magnetic material containing the core-shell type magnetic particle and having magnetic permeability controlled at high frequencies.

2. Description of the Related Art

Magnetic materials are applied in electromagnetic wave absorbers, magnetic ink, inductor and the like, and their importance is increasing year after year. In these magnetic components, permeability real part ($\mu'$) or permeability imaginary part ($\mu''$) are used. For example, both a high $\mu'$ and a low $\mu''$ are used for inductor. A high $\mu''$ is used for electromagnetic wave absorber. Accordingly, when used actually as components, $\mu'$ and $\mu''$ must be controlled according to an operating frequency band of an electronic device. Recently, the operating frequency band of the electronic device is becoming higher, and therefore, the technology for manufacturing materials capable of controlling $\mu'$ and $\mu''$ at high frequency is being demanded.

Magnetic materials for inductor to be used in a high frequency region of 1 MHz include ferrite and amorphous alloy. These magnetic materials show excellent magnetic characteristics, without magnetic loss in a region of 1 MHz to 10 MHz (low $\mu''$), and having a high $\mu'$. In these magnetic materials, however, the permeability real part $\mu'$ is lowered in a higher frequency region of 10 MHz or more, and satisfactory characteristics are not always obtained.

Accordingly, various efforts have been attempted to develop inductance elements by thin film technologies, such as a sputtering method and a plating method, and excellent characteristics in a high frequency region have been confirmed. However, a large apparatus is needed for the thin film technologies such as the sputtering method, and precise control of film thickness and the like is needed. For this reason, the performance is not sufficiently satisfactory in the aspects of cost or yield. Further, the inductor produced by the thin film technology is insufficient in long-term thermal stability of magnetic characteristics in the conditions of high temperature and high humidity.

On the other hand, in the electromagnetic wave absorber, a high $\mu''$ is used to absorb noise generated along with high frequency of an electronic appliance to thereby reduce malfunctions and other problems of electronic devices. Examples of an electronic device include a semiconductor device such as an IC chip, and various communication devices. Such electronic devices are used in a high frequency region from 1 MHz to several GHz, or tens of GHZ or more. Recently, in particular, electronic devices to be used in a high frequency region of 1 GHz or more are increasing in number. Electromagnetic wave absorbers of electronic devices to be used in a high frequency region have been conventionally manufactured by a binder forming method of mixing ferrite particle, carbonyl iron particle, FeAlSi flakes, FeCrAl flakes etc. with resins. In these materials, however, both $\mu'$ and $\mu''$ are extremely low in a high frequency region of 1 GHz or more, and satisfactory characteristics are not always obtained.

Additionally, in materials synthesized by a mechanical alloying method or the like, long-term thermal stability is insufficient, and the yield is low.

BRIEF SUMMARY OF THE INVENTION

According to the present invention, there is provided a core-shell type magnetic particle comprising:

magnetic metal particle including a magnetic metal containing at least one selected from the group consisting of Fe, Co and Ni, a nonmagnetic metal and at least one element selected from carbon and nitrogen; and an oxide coating layer formed on a surface of the magnetic metal particle and being made of an oxide or a composite oxide containing the nonmagnetic metal which is one of the constituents of the magnetic metal particle.

DETAILED DESCRIPTION OF THE INVENTION

A core-shell type magnetic particle and a high-frequency magnetic material according to embodiments of the present invention will be explained in detail.

The core-shell type magnetic particle according to the embodiment comprises magnetic metal particle and an oxide coating layer formed on the surface of the magnetic metal particle. The magnetic metal particle includes a magnetic metal containing at least one type selected from the group consisting of Fe, Co and Ni, a nonmagnetic metal and at least one element selected from carbon and nitrogen. The oxide coating layer is made of an oxide or composite oxide containing at least one nonmagnetic metal that is one of the constituents of the magnetic metal particle.

The magnetic metal in the magnetic metal particle contains at least one metal selected from the group consisting of Fe, Co and Ni. Particularly, Fe-based alloy, Co-based alloy and Fe—Co-based alloy can attain high saturation magnetization and are therefore preferable. The Fe-based alloy contains, for example, Ni, Mn and Cu as a second component. Examples of the Fe-based alloy may include Fe—Ni alloy, Fe—Mn alloy and Fe—Cu alloy. The Co-based alloy contains, for example, Ni, Mn and Cu as a second component. Examples of the Co-based alloy may include a Co—Ni alloy, Co—Mn alloy and Co—Cu alloy. Examples of the Fe—Co-based alloy may include alloys containing Ni, Mn, Cu and the like as a second component. These second components are effective to improve the high-frequency magnetic characteristics of core-shell type magnetic particle.

Examples of the nonmagnetic metal in the magnetic metal particle include at least one metal selected from the group consisting of Mg, Al, Si, Ca, Zr, Ti, Hf, Zn, Mn, rare earth elements, Ba and Sr. These nonmagnetic metals are preferably used to be able to impart insulation to the oxide coating layer stably, because these nonmagnetic metals are elements each having a small standard generation Gibbs' energy of oxide to be easily oxidized, and are contained as one of the structural components of the oxide coating layer forming the surface of the magnetic metal particle. Among these nonmagnetic metals, Al and Si are preferably used, because each metals easily forms solid solution with Fe, Co and Ni used as major components of the magnetic metal particle to contribute to an improvement in the thermal stability of the core-shell type magnetic particle.

In the magnetic metal particle, carbon and nitrogen are contained in a separated or coexistent state. At least one of carbon and nitrogen forms a solid solution with the magnetic metal to thereby make it possible to increase the magnetic anisotropy of the core-shell type magnetic particle. A high-frequency magnetic material containing core-shell type magnetic particle having such a large magnetic anisotropy makes it possible to increase ferromagnetic resonance frequency. Specifically, the permeability real part (µ') largely drops whereas the permeability imaginary part (µ") largely increases in the vicinity of the ferromagnetic resonance frequency. Therefore, a high-frequency magnetic material with a high ferromagnetic resonance frequency is suitably used in a high-frequency band.

A non-magnetic metal and an element such as carbon preferably contain in an amount of 20 atom % or less in magnetic metal particle, respectively. When each content of the non-magnetic metal and an element such as carbon exceeds 20 atom %, there is a risk of the saturation magnetization of the magnetic particle deteriorating.

At least two components selected from the magnetic metal, nonmagnetic metal and elements such as carbon and nitrogen preferably form a mutual solid solution. The formation of a solid solution ensures that the magnetic anisotropy of the core-shell type magnetic particle can be efficiently improved. Therefore, the high-frequency magnetic characteristics can be improved. Also, the mechanical characteristics of the core-shell type magnetic particle can be improved. Specifically, if the magnetic metal, nonmagnetic metal and elements such as carbon do not form a solid solution but segregate at the grain boundary and on the surface of the magnetic metal particle, there is a risk of it being difficult to improve the magnetic anisotropy and mechanical characteristics effectively.

The magnetic metal particle is preferably single crystals though this takes any form of polycrystals and single crystals. In the case where the high-frequency magnetic material is integrated with the core-shell type magnetic particle containing single crystal magnetic metal particle, it is possible to control the magnetic anisotropy of the high-frequency magnetic material because the axes of easy magnetization can be uniformed in direction. Such a high-frequency magnetic material is more improved in high-frequency characteristics than a high-frequency magnetic material containing core-shell type magnetic particle including polycrystal magnetic metal particle.

The magnetic metal particle has an average diameter of preferably 1 nm or more and 1000 nm or less and more preferably 10 nm or more and 50 nm or less. If the average diameter is less than 10 nm, there is a risk of super-paramagnetism arising, leading to reduced quantity of magnetic flux. If the average diameter exceeds 1000 nm, on the other hand, eddy-current loss is increased in a high-frequency range and there is therefore a risk of the magnetic characteristics in an intended high-frequency range deteriorating.

Moreover, a stable energy state may be formed more easily in a multiple magnetic domain structure than in a single magnetic domain structure. At this time, the high frequency characteristic of permeability in the multiple magnetic domain structure is lower than that in the single magnetic domain structure. Therefore, when applied in magnetic components for high frequency, it is preferred that the core-shell type magnetic metal particle is present as single magnetic domain particle. The maximum particle size of the single magnetic domain structure is about 50 nm or less. Summing up, the particle size of magnetic metal particle is preferred to be 50 nm or less.

Summing up, the magnetic metal particle has an average diameter of preferably 1 nm or more and 1000 nm or less, and more preferably 10 nm or more and 50 nm or less.

Though the magnetic metal particle may have a spherical form, this preferably has a flat form or bar form having a large aspect ratio (for example, 10 or more). The bar form includes a spheroid. Here, the "aspect ratio" means a ratio of height to diameter (height/diameter). In the case of a spherical form, the aspect ratio is 1 because the height is equal to the diameter. The aspect ratio of flat particle is "diameter/height". The aspect ratio of a bar form is "length of a bar/diameter of the bottom of a bar". The aspect ratio of a spheroid is "major axis/minor axis". If the aspect ratio is made large, it is possible to provide magnetic anisotropy owing to the shape, making it possible to improve the high-frequency characteristic of magnetic permeability. In addition, when the core-shell type magnetic particle are integrated to produce a desired member, the magnetic particle can be easily oriented by applying a magnetic field and also, the high-frequency characteristic of magnetic permeability can be improved. Also, if the aspect ratio is increased, the limit particle diameter of the magnetic metal particle having a single magnetic domain structure can be made larger, for example, a particle diameter exceeding 50 nm. In the case of spherical magnetic metal particle, the limit particle diameter of the magnetic metal particle having a single magnetic domain structure is about 50 nm. The limit particle diameter of flat magnetic metal particle having a higher aspect ratio can be made to be larger, so that the high-frequency characteristic of magnetic permeability does not deteriorate. Generally, particle having a larger diameter is synthesized more easily and it is therefore advantageous from the viewpoint of production that magnetic metal particle has a larger aspect ratio. Moreover, if a larger aspect ratio is used, the packing ratio can be made large when core-shell type magnetic particle having magnetic metal particle is integrated to produce a desired member. Therefore, the saturation magnetization per volume or weight of the member can be made large with the result that the magnetic permeability can also be increased.

The oxide coating layer formed on the surface of the magnetic metal particle is made of an oxide or composite oxide containing at least one nonmagnetic metal which is one of the structural components of the magnetic metal particle. This oxide coating layer not only improves the oxidation resistance of the inside magnetic metal particle but also makes magnetic particle electrically apart from each other, thereby enabling electric resistance of the member to be increased when core-shell type magnetic particle coated with the oxide coating layer are integrated to produce a desired member. If the electric resistance of the member is increased, eddy-current loss at high frequencies can be limited and the high-frequency characteristic of magnetic permeability can be improved. For this reason, the oxide coating layer preferably has a high resistance and preferably has a resistance of 1 mΩ·cm or more.

At least one nonmagnetic metal selected from the group consisting of Mg, Al, Si, Ca, Zr, Ti, Hf, Zn, Mn, rare earth elements, Ba and Si is an element of which the oxide has a small standard generation Gibbs' energy and which is easily oxidized, so that it easily forms a stable oxide as mentioned above. The oxide coating layer constituted of an oxide or composite oxide containing at least one or more of such nonmagnetic metals can improve adhesion or bonding ability to the magnetic metal particle and also, the thermal stability of the magnetic metal particle can be improved. Among these nonmagnetic metals, Al and Si are preferably used, because each metals easily form a solid solution with Fe, Co and Ni which are major components of the magnetic metal particle and contribute to an improvement in the thermal stability of the core-shell type magnetic particle. Composite oxides containing plural types of nonmagnetic metals include those having solid solution forms.

The oxide coating layer preferably has a thickness of 0.1 nm or more and 100 nm or less. If the thickness of the oxide coating layer is designed to be less than 0.1 nm, there is a risk of obtaining insufficient oxidation resistance. Also, when the core-shell type magnetic particle coated with the oxide coating layer is integrated to produce a desired member, there is a risk of the electric resistance of the member dropping, so that eddy-current loss is easily caused and the high-frequency characteristic of magnetic permeability deteriorates. If the thickness of the oxide coating layer exceeds 100 nm, on the other hand, the packing ratio of the magnetic metal particle contained in the member is reduced by the rate corresponding to the thickness of the oxide coating layer when the core-shell type magnetic particle coated with the oxide coating layer are integrated to produce a desired member, and there is a risk of the saturation magnetization of the member being reduced, which brings about a reduction in magnetic permeability.

Examples of the form of the high-frequency magnetic material containing the core-shell magnetic particle according to the present embodiment include a powder, bulk (for example, a pellet form, ring form and rectangular form) and a film form including a sheet.

A film-like high-frequency magnetic material includes a laminate structure obtained by alternately laminating a plural insulating oxide layers (magnetic material layers) containing the core-shell type magnetic particle and having a thickness of 1 µm or less and a nonmagnetic insulating oxide layer having a thickness of 1 µm or less, followed by heating and baking. That is, the high-frequency magnetic material comprises the magnetic material layers and the nonmagnetic insulating oxide layers, and the magnetic material layers and the nonmagnetic insulating oxide layers being alternately laminated. The nonmagnetic insulating oxide in the nonmagnetic insulating oxide layer is preferably oxide or composite oxide of at least one metal selected from the group consisting of Mg, Al, Si, Ca, Zr, Ti, Hf, Zn, Mn, rare earth elements, Ba and Sr. More preferably, the nonmagnetic insulating oxide includes the same nonmagnetic element with that in the coating oxide layer of the core-shell magnetic particle in magnetic material layer. Such an insulating oxide layer can improve adhesion or bonding ability to the magnetic material layer, and can improve high thermal stability. When the thickness of the magnetic material layer containing the core-shell type magnetic particle is made to be less than 1 µm in such a film-like high-frequency magnetic material, the influence of a diamagnetic field can be decreased when a high-frequency magnetic field is applied in an in-plane direction, and an increase in magnetic permeability can be attained. Also, when the magnetic material layer is not simply laminated but laminated through the nonmagnetic insulating oxide layer, magnetic coupling can be cut and it is therefore possible to decrease the influence of a diamagnetic field in bulk total. Specifically, magnetic coupling among the magnetic material layers is cut to thereby decrease the size of a magnetic pole by interposing the nonmagnetic insulating oxide layer between the magnetic material layers, making it possible to decrease the influence of a diamagnetic field. Moreover, the magnetic material layer can be made substantially thick and therefore, the magnetic characteristic (magnetic permeability×thickness) in bulk total can be improved.

The high-frequency magnetic material according to the embodiment may be subjected to various processing works during the course of a process for manufacturing high-frequency magnetic parts. In the case of, for example, a baked body, mechanical processing works such as abrasive works and cutting works are carried out. In the case of a powder, it is mixed with a resin such as an epoxy resin and polybutadiene. Moreover, surface treatment is carried out if necessary. When the high-frequency magnetic parts are an inductor, choke coil, filter and transformer, winding treatment is carried out.

In the core-shell type magnetic particle according to the embodiment explained above, the magnetic metal particle including a magnetic metal containing at least one selected from the group consisting of Fe, Co and Ni, a nonmagnetic metal and at least one element selected from carbon and nitrogen has high saturation magnetization, and the oxide coating layer made of an oxide or composite oxide containing at least one nonmagnetic metal, which is one of the constituents of the magnetic metal particle, is formed on the surface of the magnetic metal particle and having high insulating ability. As a result, by coating the surface of the magnetic metal particle having high saturation magnetization with the oxide coating layer having high insulation, core-shell type magnetic particle which can limit an eddy-current loss being a cause of a loss at high frequencies and has a highly anisotropic magnetic field can be obtained.

A high-frequency magnetic material containing such core-shell type magnetic particle has excellent magnetic characteristics making it possible to control the magnetic permeability, that is, a magnetic permeability real part ($\mu'$) and a magnetic permeability imaginary part ($\mu''$) in a high-frequency range of 10 MHz or more and particularly 100 MHz to GHz, and also has thermal stability to keep excellent magnetic characteristics for a long period of time.

Specifically, the high-frequency magnetic material has almost no loss except for ferromagnetic resonance loss and has a high magnetic permeability at high frequencies, and its ferromagnetic resonance frequency extends to several GHz. Therefore, the high-frequency magnetic material exhibits a high magnetic permeability real part ($\mu'$) and a low magnetic permeability imaginary part ($\mu''$) in a frequency band less than the ferromagnetic resonance frequency. The high-frequency magnetic material can be therefore utilized efficiently as high magnetic permeability parts such as inductors, filters, transformers, choke coils, and antenna substrates for portable telephones and wireless LANs. On the other hand, the high-frequency magnetic material has a low $\mu'$ and a high $\mu''$ at frequencies close to the ferromagnetic resonance frequency and may be therefore utilized as an electromagnetic wave absorber. In other words, the high-frequency magnetic material has such a high versatility that one high-frequency magnetic material can be used as a high magnetic permeability part and also as an electromagnetic wave absorber by selecting proper frequency bands.

In the core-shell type magnetic particle and high-frequency magnetic material according to the embodiment, its material structure can be determined (analyzed) by scanning electron microscopy (SEM) or transmission electron microscopy (TEM), diffraction pattern (including the confirmation of a solid solution) by TEM diffraction or X-ray diffraction (XRD), and identification and quantitative analysis of constituent elements by inductively-coupled plasma (ICP) emission analysis, fluorescent X-ray analysis, electron probe microanalysis (EPMA), energy dispersive X-ray fluorescence spectrometer (EDX) or the like. The average diameter of the magnetic metal particle may be found by measuring the longest and shortest diagonal lines of an individual particle as a particle diameter by TEM observation or SEM observation and by calculating an average of many particle diameters.

Examples of the present invention will be explained in more detail in contrast with Comparative Examples.

It is to be noted that the average crystal particle diameter of the magnetic metal particles in Examples and Comparative examples of the present invention was measured by TEM observation. Specifically, an average of the longest and shortest diagonal lines of an individual particle taken as a photograph by TEM observation was defined as a particle diameter. An average of many particle diameters was calculated. In the photograph, three or more unit areas of 10 μm×10 μm were picked up to calculate an average of particle diameters of particle in these areas.

Also, the component analysis of a microstructure was made based on EDX analysis.

EXAMPLE 1

Argon was introduced into a chamber of a high-frequency induction heating plasma apparatus as plasma generating gas at a rate of 40 L/min to generate a plasma. An Fe powder having an average diameter of 10 μm and an Al powder having an average diameter of 3 μm were sprayed as raw materials in a ratio by weight of 20:1 (Fe:Al) together with argon (carrier gas) at a rate of 3 L/min into the plasma in the chamber. At the same time, acetylene gas was introduced as a raw material for carbon coating together with the carrier gas in the chamber to obtain nano-particle of Fe—Al alloy particles coated with carbon. These carbon-coated Fe—Al nano-particles were subjected to reducing treatment carried out at 650° C. in a hydrogen flow rate of 500 mL/min, cooled to ambient temperature and taken out in an argon atmosphere including 0.1% by volume of oxygen to oxidize, thereby manufacturing core-shell type magnetic particles.

The obtained core-shell type magnetic particles had a structure in which the average diameter of the magnetic metal particle of the core was 32 nm and the thickness of the oxide coating layer was 4 nm. The magnetic metal particles as the core were constituted of Fe—Al—C and the oxide coating layer was constituted of Fe—Al—O.

The core-shell type magnetic particles and an epoxy resin were mixed with each other in a ratio of 100:10 to make a thick film as a high-frequency magnetic material.

EXAMPLE 2

Core-shell type magnetic particles were produced in the same manner as in Example 1 except that, nitrogen for nitriding treatment was introduced into the chamber of the high-frequency induction heat plasma apparatus together with argon used as a plasma generating gas instead of introducing acetylene gas for the carbonization treatment in Example 1.

The obtained core-shell type magnetic particles had a structure in which the average diameter of the magnetic metal particle of the core was 41 nm and the thickness of the oxide coating layer was 4 nm. The magnetic metal particles as the core were constituted of Fe—Al—N and the oxide coating layer was constituted of Fe—Al—O.

The core-shell type magnetic particles and an epoxy resin were mixed with each other in a ratio of 100:10 to make a thick film as a high-frequency magnetic material.

EXAMPLE 3

Core-shell type magnetic particles were produced in the same manner as in Example 1 except that an Fe powder having an average diameter of 10 μm and a Si powder having an average diameter of 5 μm were sprayed together with argon (carrier gas) into a plasma in the chamber of the high-frequency induction heat plasma apparatus in a ratio by weight of 40:1 (Fe:Si).

The obtained core-shell type magnetic particles had a structure in which the average diameter of the magnetic metal particle of the core was 38 nm and the thickness of the oxide coating layer was 3 nm. The magnetic metal particles as the core were constituted of Fe—Si—C and the oxide coating layer was constituted of Fe—Si—O.

The core-shell type magnetic particles and an epoxy resin were mixed with each other in a ratio of 100:10 to make a thick film as a high-frequency magnetic material.

COMPARATIVE EXAMPLE 1

Core-shell type magnetic particles were produced in the same manner as in Example 1 except that an Fe powder having an average diameter of 10 μm and an Al powder having an average diameter of 3 μm were sprayed as raw materials together with argon (carrier gas) at a rate of 3 L/min into a plasma in the chamber of the high-frequency induction heat plasma apparatus in a ratio by weight of 20:1 (Fe:Al) and acetylene gas for carbonization treatment was not introduced.

The obtained core-shell type magnetic particles had a structure in which the average diameter of the magnetic metal particle of the core was 40 nm and the thickness of oxide coating layer was 5 nm. The magnetic metal particles as the core were constituted of Fe—Al and the oxide coating layer was constituted of Fe—O. In the magnetic metal particles as the core, Al was segregated and the composition was inhomogeneous.

The core-shell type magnetic particles and an epoxy resin were mixed with each other in a ratio of 100:10 to make a thick film as a high-frequency magnetic material.

The outlines of the magnetic metal particle and oxide coating layer of the core-shell type magnetic particles obtained in Examples 1 to 3 and Comparative Example 1 are shown in Table 1 below.

Also, the high-frequency magnetic materials obtained in Examples 1 to 3 and Comparative Example 1 were used as samples for evaluation to examine the magnetic permeability real part (μ'), a change in the magnetic permeability real part (μ') with time after 100 hours and electromagnetic wave absorbing characteristics by using the following methods. The results are shown in Table 2 below.

1) Magnetic Permeability Real Part μ'

Induction voltage and impedance were measured using a PMM-9G1 System manufactured by Ryowa Electronics Co., Ltd. at 1 GHz when air was used as the background or when the sample was disposed, and the magnetic permeability real part μ' was found from these induction voltage and impedance. As the sample, one obtained by cutting the sample for evaluation into a size of 4×4×0.5 mm was used.

2) Change in the Magnetic Permeability μ' with Time After 100 Hours

The sample for evaluation was allowed to stand in a thermohygrostat kept at 60° C. under a humidity of 90% for 100 hours and then the magnetic permeability real part μ' was measured again to calculate a change with time (Magnetic permeability real part μ' after being allowed to stand for 100 Hrs/Magnetic permeability real part μ' before being allowed to stand).

3) Electromagnetic Wave Absorbing Characteristic

A metal thin plate having a thickness of 1 mm and the same area as each of the surface of the sample which surface was irradiated with electromagnetic wave and the opposite surface of the sample were applied to each other to perform measurement in an electromagnetic wave at 2 GHz in a free space by using a $S_{11}$ mode of a network analyzer according to a reflective power method. This reflective power method measures a reduction (dB) in reflecting level from the sample as compared with the reflecting level from the metal thin plate (perfect reflective body) to which the sample was not bonded. Based on this measurement, the amount of electromagnetic wave to be absorbed was defined by this return loss and found as a relative value when the absorption amount of Comparative Example 1 was set to 1.

had a resonance frequency as low as 500 MHz or less and the magnetic permeability was dropped to about 1 at 1 GHz which was not different from that of air. This low magnetic characteristic is caused by the oxide coating layer insufficient to provide material insulation in the core-shell particles of Comparative Example 1. In the core-shell particles having an unsatisfactory oxide coating layer, individual magnetic metal particle are electrically connected to one another, leading to the generation of an eddy-current loss at high frequencies. It

TABLE 1

| | Magnetic metal particle | | | | | Oxide coating layer | |
|---|---|---|---|---|---|---|---|
| | Magnetic metal | Nonmagnetic metal | C or N | Composition | Average diameter (μm) | Composition | Thickness (nm) |
| Example 1 | Fe | Al | C | Fe:Al:C = 81:3:7 | 32 | Fe—Al—O | 4 |
| Example 2 | Fe | Al | N | Fe:Al:N = 80:4:8 | 41 | Fe—Al—O | 4 |
| Example 3 | Fe | Si | C | Fe:Si:C = 77:4:6 | 38 | Fe—Si—O | 3 |
| Comparative Example 1 | Fe | Al | — | Large variation | 40 | Fe—O | 5 |

TABLE 2

| | Characteristics of high-frequency magnetic material | | |
|---|---|---|---|
| | Magnetic permeability real part μ' (less than 1 GHz) | Variation with time in magnetic permeability real part μ' (less than 1 GHz) after 100 hrs | Electromagnetic wave absorbing characteristics (less than 2 GHz) |
| Example 1 | 5 | 0.95 | 1.6 |
| Example 2 | 4 | 0.98 | 1.7 |
| Example 3 | 5 | 0.94 | 1.5 |
| Comparative Example 1 | 1 | — | 1.0 |

As is clear from the above Table 1, it is confirmed that in the core-shell type magnetic particles according to Examples 1 to 3, magnetic metal particle containing Fe that is a magnetic metal, Al or Si that is a nonmagnetic metal and carbon or nitrogen and having an average diameter of about 30 to 40 nm are coated with an oxide coating layer having a thickness of 3 to 4 nm and containing a nonmagnetic metal that is one of the structural components of the magnetic metal particle. On the other hand, the magnetic particles according to Comparative Example 1 have a core-shell structure. However, these magnetic particles contain magnetic metal particle having neither carbon nor nitrogen. In the magnetic metal particles as the core, Al was segregated and the composition was inhomogeneous.

As is clear from Table 2, it is understood that the high-frequency magnetic materials according to Examples 1 to 3 have more excellent magnetic characteristics than the high-frequency magnetic material of Comparative Example 1. The reason is considered to be that each of the high-frequency magnetic materials according to Examples 1 to 3 has adequate magnetic anisotropy and can attain high magnetic permeability because the magnetic metal particle in the core-shell type magnetic particle contain carbon or nitrogen as a solid solution and have a core-shell structure. It is to be noted that though the magnetic permeability real part (μ') is measured only at 1 GHz, it exhibits a flat frequency characteristic and has almost the same value even at 100 MHz. On the other hand, the material according to Comparative Example 1 had an initial magnetic permeability of 3. However, this material is considered that as a result, the magnetic permeability is dropped in a 1 GHz band and the material is not regarded as a magnetic body.

Also, it is found that the magnetic permeability real part (μ') is not decreased even after 200 hours in high-frequency magnetic materials obtained in Examples 1 to 3, and therefore these magnetic materials have significantly high thermal stability. The reason is considered to be that because the high-frequency magnetic material takes a structure in which the magnetic metal particle are coated with the oxide coating layer containing a nonmagnetic metal which is one of the constituents of the magnetic metal particle, the bond at the core-shell boundary is more stabilized and therefore high thermal stability is attained. The high-frequency magnetic material according to Comparative Example 1 has a magnetic permeability of 1 at 1 GHz before and after 100 hours, so that it is put in the same permeability condition as air (an eddy-current loss is caused at high frequencies, so that the magnetic permeability is dropped, with the result that the material is not regarded as a magnetic body).

As mentioned above, each of the high-frequency magnetic materials obtained in Examples 1 to 3 has a high magnetic permeability real part (μ') at 1 GHz, has a high thermal stability, has a possibility that it can be utilized as high magnetic permeability parts in a 1 GHz band, and also has an excellent electromagnetic wave characteristic at 2 GHz. Therefore, there is also a possibility that it can be utilized as an electromagnetic wave absorber. In other words, it is found that the high-frequency magnetic material has such a high versatility that even one material can be used as high magnetic permeability parts and also as an electromagnetic wave absorber by changing working frequency bands.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic particle comprising:
   a magnetic metal particle including a magnetic metal selected from the group consisting of Fe, Co and Ni, a nonmagnetic metal and at least one element selected from carbon and nitrogen, the element forming a solid solution with the magnetic metal, wherein the magnetic metal particle is a single crystal or a polycrystal; and an oxide coating layer formed on a surface of the magnetic metal particle and being made of an oxide or a composite oxide, wherein the oxide or the composite oxide each contain the nonmagnetic metal which is one of the constituents of the magnetic metal particle.

2. The magnetic particle according to claim 1, wherein the nonmagnetic metal is at least one metal selected from the group consisting of Mg, Al, Si, Ca, Zr, Ti, Hf, Zn, Mn, rare earth elements, Ba and Sr.

3. The magnetic particle according to claim 1, wherein the nonmagnetic metal and the element are each in an amount of 20 atom % or less in the magnetic metal particle.

4. The magnetic particle according to claim 1, wherein the magnetic metal particle has an average diameter of 1 nm or more and 1000 nm or less.

5. The magnetic particle according to claim 1, wherein the magnetic metal particle has an aspect ratio of 10 or more.

6. The magnetic particle according to claim 1, wherein the oxide coating layer has a thickness of 0.1 nm or more and 100 nm or less.

7. A high-frequency magnetic material containing the magnetic particle according to claim 1.

8. A high-frequency magnetic material comprising:
a plurality of magnetic material layers containing the magnetic particle according to claim 1 and each layer having a thickness of 1 μm or less; and
a plurality of nonmagnetic insulating oxide layers, each layer having a thickness of 1 μm or less,
wherein the magnetic material layers and the nonmagnetic insulating oxide layers are alternately laminated.

9. The high-frequency magnetic material according to claim 8, wherein the nonmagnetic insulating oxide is an oxide of at least one metal selected from the group consisting of Mg, Al, Si, Ca, Zr, Ti, Hf, Zn, Mn, rare earth elements, Ba and Sr.

10. The high-frequency magnetic material according to claim 9, wherein the nonmagnetic insulating oxide is made of an oxide or a composite oxide containing at least one nonmagnetic metal which is the constituent of the oxide coating layer of the magnetic particle in magnetic material layer.

* * * * *